US008341561B2

United States Patent
Park et al.

(10) Patent No.: US 8,341,561 B2
(45) Date of Patent: *Dec. 25, 2012

(54) METHODS OF ARRANGING MASK PATTERNS AND ASSOCIATED APPARATUS

(75) Inventors: Dong-woon Park, Seoul (KR);
Woo-sung Han, Seongnam-si (KR);
Seong-woon Choi, Suwon-si (KR);
Jeong-ho Yeo, Suwon-si (KR)

(73) Assignee: Samsung Electronics Co., Ltd.,
Samsung-ro, Yeongtong-gu, Suwon-si,
Gyeonggi-do (KR)

( * ) Notice: Subject to any disclaimer, the term of this patent is extended or adjusted under 35 U.S.C. 154(b) by 43 days.

This patent is subject to a terminal disclaimer.

(21) Appl. No.: 12/968,178

(22) Filed: Dec. 14, 2010

(65) Prior Publication Data
US 2011/0119644 A1    May 19, 2011

Related U.S. Application Data

(63) Continuation-in-part of application No. 11/937,317, filed on Nov. 8, 2007, now Pat. No. 7,937,676.

(30) Foreign Application Priority Data

Dec. 12, 2006  (KR) .................. 10-2006-0126379

(51) Int. Cl.
*G06F 17/50*  (2006.01)
(52) U.S. Cl. ............. 716/54; 716/50; 716/51; 716/52; 716/53; 716/55; 430/5; 430/30
(58) Field of Classification Search .............. 716/50–55; 430/5, 30
See application file for complete search history.

(56) References Cited

U.S. PATENT DOCUMENTS

| 7,260,930 | B2 * | 8/2007 | Decou et al. ........... 60/295 |
| 7,349,066 | B2 | 3/2008 | Eurlings et al. |
| 7,487,489 | B2 * | 2/2009 | Granik ................. 716/51 |
| 7,620,930 | B2 | 11/2009 | Van Den Broeke et al. |
| 7,721,246 | B2 * | 5/2010 | Li et al. ............... 716/55 |
| 7,937,676 | B2 * | 5/2011 | Park ................... 716/55 |
| 7,954,073 | B2 * | 5/2011 | Park ................... 716/55 |
| 2005/0142470 | A1 | 6/2005 | Socha et al. |
| 2006/0075377 | A1 | 4/2006 | Van Den Broeke et al. |

(Continued)

FOREIGN PATENT DOCUMENTS

KR    1020050041958    5/2005

(Continued)

OTHER PUBLICATIONS

Li, et al., "Rapid search of the optimum placement of assist feature to improve the aerial image gradient in iso-line structure" SPIE vol. 6520, 2007.

*Primary Examiner* — Nghia Doan
(74) *Attorney, Agent, or Firm* — Muir Patent Consulting, PLLC (57) ABSTRACT

Methods and apparatus are disclosed that arrange mask patterns in response to the contribution of a second pattern to image intensity. In some methods of arranging mask patterns, a distribution of functions $h(\xi-x)$ is obtained which represents the contribution of a second pattern to image intensity on a first pattern. Neighboring regions of the first pattern are discretized into finite regions, and the distribution of the functions $h(\xi-x)$ is replaced with representative values $\bar{h}(x,\xi)$ of the discretized regions. A position of the second pattern is determined using polygonal regions having the same $\bar{h}(x,\xi)$. As described, the term x is the position of the first pattern and the term $\xi$ is the position of the assist.

18 Claims, 10 Drawing Sheets

| U.S. PATENT DOCUMENTS | | | |
|---|---|---|---|
| 2006/0147815 A1 | 7/2006 | Melvin, III et al. | |
| 2006/0188673 A1 | 8/2006 | Melvin, III et al. | |
| 2006/0236296 A1 | 10/2006 | Melvin, III et al. | |
| 2008/0005704 A1 | 1/2008 | Miloslavsky et al. | |
| 2008/0301620 A1 | 12/2008 | Ye et al. | |

| FOREIGN PATENT DOCUMENTS | | |
|---|---|---|
| KR | 1020050069518 | 7/2005 |
| KR | 1020060050603 | 5/2006 |
| KR | 102008015615 | 2/2008 |

\* cited by examiner

METHODS OF ARRANGING MASK PATTERNS AND ASSOCIATED APPARATUS

CROSS-REFERENCE TO RELATED PATENT APPLICATION

This application is a continuation-in-part application of U.S. patent application Ser. No. 11/937,317, filed on Nov. 8, 2007 now U.S. Pat. No. 7,937,676, in the U.S. Patent and Trademark Office, which claims priority to Korean Patent Application No. 10-2006-0126379, filed on Dec. 12, 2006 in the Korean Intellectual Property Office, the disclosures of each of which are incorporated herein in their entirety by reference.

BACKGROUND OF THE INVENTION

1. Field of the Invention

The present invention relates to fabricating of semiconductor features, and more particularly, to methods and apparatus for arranging mask patterns.

2. Description of the Related Art

One of the typical goals in integrated circuit fabrication is to faithfully reproduce an original circuit design on a semiconductor wafer using a mask while using as much area of the semiconductor wafer as possible. Another typical goal is to optimize exposure and improve image intensity on the semiconductor wafer.

SUMMARY OF THE INVENTION

Various disclosed embodiments provide methods and computer program products that determine a position of a pattern on a mask. Some of the methods and computer program products may increase the speed with which the position of the pattern can be determined.

According to some embodiments, a method of arranging mask patterns includes: obtaining a distribution of functions $h(\xi-x)$ representing the contribution of a second pattern to image intensity on the first pattern; discretizing neighboring regions of the first pattern into finite regions, and replacing the distribution of the functions $h(\xi-x)$ with representative values $\bar{h}(x,\xi)$ of the discretized regions; and determining a position of the second pattern by using polygonal regions having the same $\bar{h}(x,\xi)$, where x is the position of the first pattern and $\xi$ is the position of the second pattern. The discretizing of the neighboring regions of the first pattern into the finite regions may comprise discretizing the neighboring regions into finite square shaped regions. The neighboring regions of the first pattern may have a width W of 10 to 2000 pixels.

The obtaining of the distribution of the functions $h(\xi-x)$ may comprise obtaining the functions $h(\xi-x)$ that satisfy $$\frac{I(x) - I_0(x)}{2\sqrt{I_0(x)}} = h(\xi-x)m(\xi)\Delta\xi,$$

where $I(x)$ is an image intensity on the first pattern when the second pattern is present, $I_0(x)$ is an image intensity on the first pattern when the second pattern is not present, and $m(\xi)$ is a mask transmittance.

The discretizing may comprise: discretizing the distribution of the functions $h(\xi-x)$ into finite regions, replacing the distribution of the functions $h(\xi-x)$ with a distribution of $\hat{h}(x,\xi)$ consisting of $\hat{h}_0, \hat{h}_1, \hat{h}_2, \ldots, \hat{h}_N$; and replacing the distribution of $\hat{h}(x,\xi)$ with the distribution of $\bar{h}(x, \xi)$ consisting of $\bar{h}_0, \bar{h}_1, \bar{h}_2, \ldots, \bar{h}_N$ and that satisfies $$\{\bar{h}_I : 0 \leq I \leq N\} = \{\hat{h}_I : 0 \leq I \leq N\} \text{ when } I \geq J, |\bar{h}_I| \geq |\bar{h}_J|.$$

The determination of the position of the second pattern may comprise: determining, by using the distribution of $\bar{h}(x,\xi)$, a region $\omega_I(I=0, 1, \ldots, N)$ satisfying $\omega_I = \{\xi : \hat{h}(\xi-x) = \bar{h}_I \text{ for some } x \in M\}$; determining, by using the region $\omega_I(I=0, 1, \ldots, N)$, a region $\gamma_N$ that satisfies $$\gamma_I = \gamma_{I-1} - \omega_I \quad \text{when } \bar{h}_I \leq 0$$
$$= \gamma_{I-1} \cup \omega_I \quad \text{when } \bar{h}_I > 0$$
$$\gamma_0 = \omega_0;$$

and determining the region $\gamma_N$ as the position of the second pattern.

The determination of the position of the second pattern may comprise: determining, with the use of $\bar{h}(x,\xi)$, a region $\omega_I(I=0, 1, \ldots, N)$ that satisfies $\omega_I = \{\xi : \hat{h}(\xi-x) = \bar{h}_I \text{ for some } x \in M\}$; obtaining a region $\gamma_N$ by excluding a region $\omega_J$ where $\bar{h}_J$ is less than 0 from a region including all the region $\omega_I(I=0, 1, \ldots, N)$; and determining the region $\gamma_N$ as the position of the second pattern.

An optical proximity correction process can be applied to the first pattern and the second pattern to obtain a critical dimension after the determining of the position of the second pattern.

A mask rule check process can be applied to improve mask performance after the determining of the position of the second pattern.

The discretizing of the neighboring regions of the first pattern into the finite regions can comprise discretizing the neighboring regions into finite square shaped regions.

In some other embodiments, a computer program product is configured to arrange mask patterns, the computer program product comprises a computer-readable storage medium having computer-readable program code embodied in the medium. The computer-readable program code comprises: computer-readable program code that is configured to obtain a distribution of functions $h(\xi-x)$ representing the contribution of a second pattern to image intensity on a first pattern; computer-readable program code that is configured to discretize neighboring regions of the first pattern into finite regions, and to replace the distribution of the functions $h(\xi-x)$ with representative values $\bar{h}(x,\xi)$ of the discretized regions; and computer-readable program code that is configured to determine a position of the second pattern by using polygonal regions having the same $\bar{h}(x,\xi)$, where x is the position of the first pattern and $\xi$ is the position of the second pattern.

The computer-readable program code obtaining of the distribution of the functions $h(\xi-x)$ can comprise computer-readable program code that obtains the functions $h(\xi-x)$ that satisfy $$\frac{I(x) - I_0(x)}{2\sqrt{I_0(x)}} = h(\xi-x)m(\xi)\Delta\xi,$$

where $I(x)$ is an image intensity on the first pattern when the second pattern is present, $I_0(x)$ is an image intensity on the first pattern when the second pattern is not present, and $m(\xi)$ is a mask transmittance.

The computer-readable program code that carries out the discretizing can comprise computer-readable program code that: discretizes the distribution of the functions h(ξ−x) into finite regions, replaces the distribution of the functions h(ξ−x) with a distribution of $\hat{h}(x,\xi)$ consisting of $\hat{h}_0, \hat{h}_1, \hat{h}_2, \ldots, \hat{h}_N$; and replaces the distribution of $\hat{h}(x,\xi)$ with the distribution of $\overline{h}(x,\xi)$ consisting of $\overline{h}_0, \overline{h}_1, \overline{h}_2, \ldots, \overline{h}_N$ and that satisfy $$\{\overline{h}_I : 0 \leq I \leq N\} = \{\hat{h}_I : 0 \leq I \leq N\} \text{ when } I \geq J, |\overline{h}_I| \geq |\overline{h}_J|.$$

The computer-readable program code that carries out the determining of the position of the second pattern can comprise computer-readable program code that: determines, by using the distribution of $\overline{h}(x,\xi)$, a region $\omega_I (I=0, 1, \ldots, N)$ satisfying $\omega_I = \{\xi : \hat{h}(\xi-x) = \overline{h}_I \text{ for some } x \in M\}$;

determines, by using the region $\omega_I (I=0, 1, \ldots, N)$, a region $\gamma_N$ satisfying $$\gamma_I = \gamma_{I-1} - \omega_I \quad \text{when } \overline{h}_I \leq 0$$
$$= \gamma_{I-1} \cup \omega_I \quad \text{when } \overline{h}_I > 0$$
$$\gamma_0 = \omega_0;$$

and determines the region $\gamma_N$ as the position of the second pattern.

The computer-readable program code that determines the position of the second pattern can comprise computer-readable program code that:

determines, with the use of $\overline{h}(x,\xi)$, a region $\omega_I (I=0, 1, \ldots, N)$ that satisfies $\omega_I = \{\xi : \hat{h}(\xi-x) = \overline{h}_I \text{ for some } x \in M\}$;

obtains a region $\gamma_N$ by excluding a region $\omega_J$ where $\overline{h}_J$ is less than 0 from a region including all the region $\omega_I (I=0, 1, \ldots, N)$; and determines the region $\gamma_N$ as the position of the second pattern.

BRIEF DESCRIPTION OF THE DRAWINGS

The above and other features and advantages disclosed herein will become more apparent by describing in detail exemplary embodiments with reference to the attached drawings in which.

DETAILED DESCRIPTION OF THE INVENTION

The present disclosure is described more fully hereinafter with reference to the accompanying drawings, in which example embodiments are shown. The described apparatus/methods may, however, be embodied in many different forms and should not be construed as limited to the example embodiments set forth herein. Rather, these embodiments are provided so that this disclosure will be thorough and complete, and will fully convey the scope of the disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "bottom," "beneath," "below," "lower," "top," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the specification and relevant art and will not be interpreted in an idealized or overly formal sense unless expressly so defined herein.

Methods/apparatus for determining positions of patterns on a mask and arranging mask patterns will now be described in accordance with various embodiments. That is, a method of improving exposure performance of a layout by adding a second pattern to the layout including a first pattern will be described. For example, the first pattern is a unit pattern of the layout, and the second pattern may be regarded as an additional pattern. The first and second patterns on the mask are exposed on a semiconductor wafer, and images (patterns)

corresponding to the first and second pattern are formed on the semiconductor wafer. In addition, the patterns on the semiconductor wafer formed by exposing the first and second patterns on the mask respectively contribute to an operation of a semiconductor device.

Image intensity I(x) generated on a semiconductor wafer by a first pattern on a mask may be approximated by $$I(x) \cong e^2(x) = \left(e_0(x) + \sum_{\xi} \Delta e(x, \xi)\right)^2 \qquad (1)$$

where x indicates the position of a first pattern, $\xi$ indicates the position of a second pattern, $e_0(x)$ indicates the contribution of the first pattern to image intensity I(x), and $$\sum_{\xi} \Delta e(x, \xi)$$

indicates the contribution of the second pattern to the image intensity I(x). An increase or decrease in the contributions of the first pattern and the second pattern leads to an increase or decrease in the image intensity I(x). Assuming that $m(\xi)$ is transmittance of the mask, the contribution of the second pattern may be given by $$\Delta e(x,\xi)=h(\xi-x)m(\xi)\Delta\xi \qquad (2)$$

Also, assuming that $I_0(x)$ is the image intensity at the first pattern when the second pattern does not exist, Equation 1 may be represented by Equations 3 through 5.

$$I_0=e_0^2 \qquad (3)$$

$$I=I_0+\Delta I \qquad (4)$$

$$\Delta I \cong 2e\Delta e \qquad (5)$$

Equation 6 may also be obtained from Equations 3 through 5.

$$\Delta e = \frac{I - I_0}{2e} \cong \frac{I - I_0}{2e_0} = \frac{I - I_0}{2\sqrt{I_0}} \qquad (6)$$

That is, the contribution of the second pattern can be represented by its relationship with the image intensity. The relationship between a function h, which represents the contribution of the second pattern, and the image intensity is defined by $$\frac{I(x) - I_0(x)}{2\sqrt{I_0(x)}} = h(\xi - x)\, m(\xi)\, \Delta\xi. \qquad (7)$$

Figure 5:
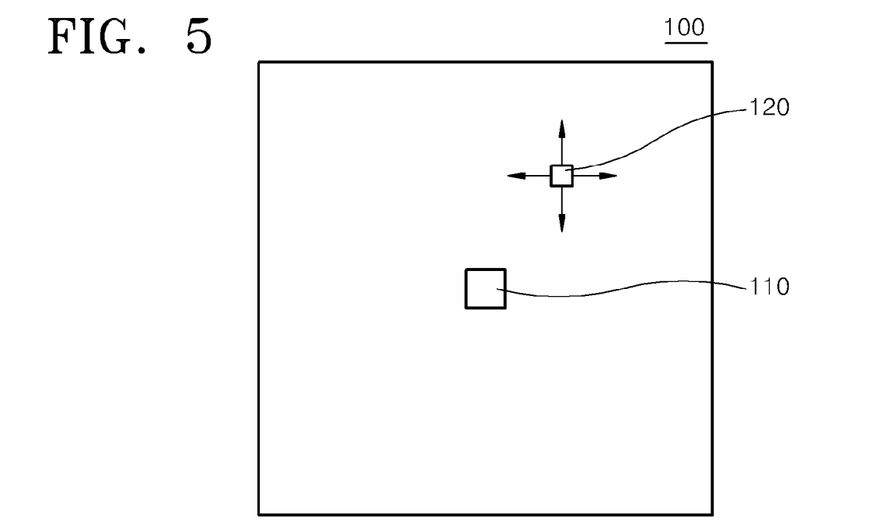
FIG. 5 is a plan view of a mask including a first pattern and a second pattern which are referenced to describe methods of deriving a function h according to some exemplary embodiments.

FIG. 5 is a plan view of a mask 100 including a first pattern 110 and a second pattern 120 that is referenced to describe a method of deriving a function h according to some exemplary embodiments. Referring to FIG. 5, a function $h(\xi-x)$ may be represented by image intensity at the first pattern 110 and mask transmittance of the second pattern 120 according to Equation 7. The function $h(\xi-x)$ is calculated by fixing the first pattern 110 formed of a small, isolated portion onto the mask 100 and sweeping the small-sized second pattern 120 over the entire domain of the mask 100 as indicated by arrows in FIG. 5. A goal here is to calculate a function h as $\xi-x$, i.e., the relative displacement between the first pattern 110 and the second pattern 120.

According to Equation 2, the function h is dependent on $\xi-x$, i.e., the relative position between the first pattern 110 and the second pattern 120, but is not directly dependent on the position of the first pattern 110. Therefore, once the function h is calculated as described above and is stored in the form of a table, even when a plurality of first patterns exist, values of functions $h(\xi-x)$ may then be more easily and quickly obtained using a look-up table method by applying the relative position $\xi-x$ between a second pattern to be reviewed and each of the first patterns to the table of the functions h calculated in advance.

Figure 1:
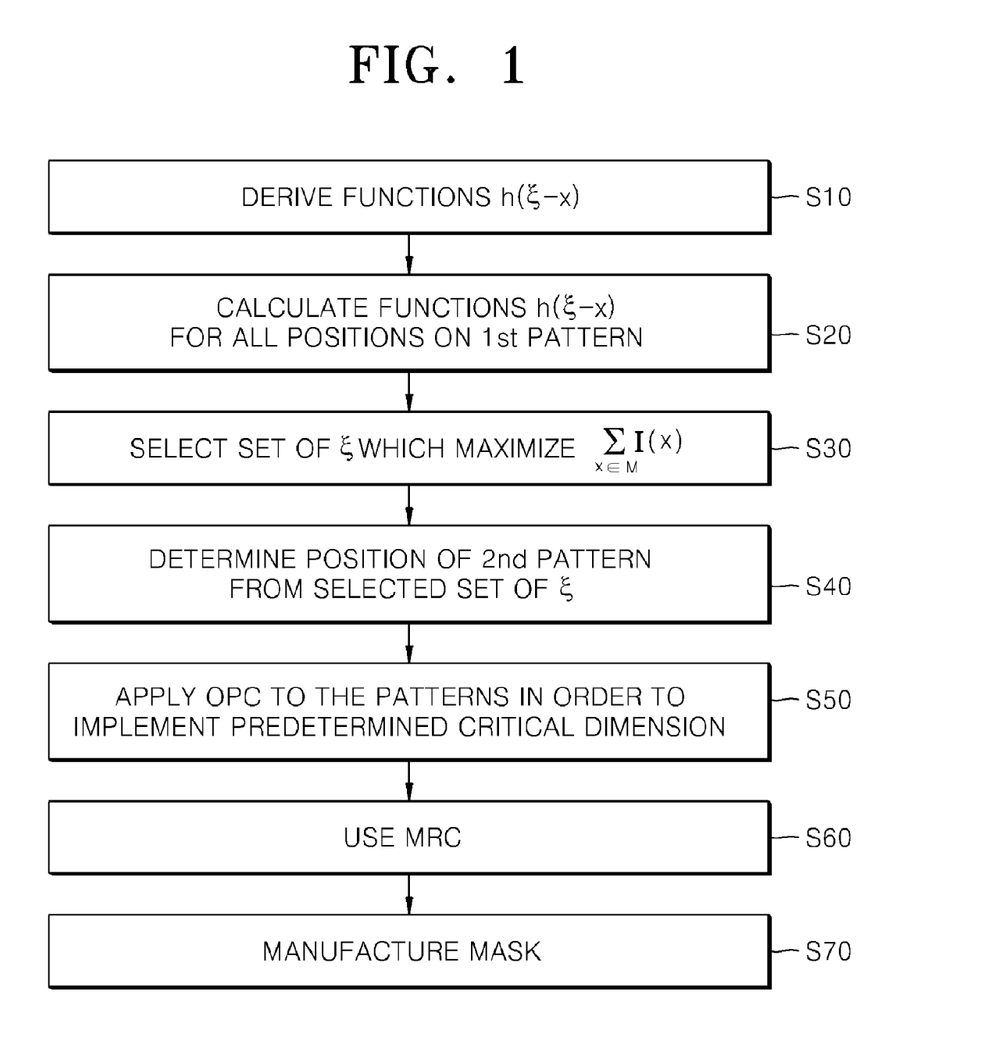
FIGS. 1 through 4 are flowcharts illustrating exemplary apparatus/methods of arranging mask patterns according to some embodiments.

FIGS. 1 through 4 are flowcharts illustrating exemplary methods/apparatus for arranging mask patterns according to some embodiments. In operation S10, functions $h(\xi-x)$ are derived as described above. Referring to FIG. 1, in operation S30, a set of $\xi$ which maximize $$\sum_{x \in M} I(x)$$

is selected. In operation S40, the position of a second pattern from the selected set of $\xi$ is determined. Here, M indicates the entire domain of a mask. That is, the second pattern is placed so as to enhance the image intensity of the entire mask. Referring to Equation 1, assuming that the condition that $$\sum_{x \in M} I(x)$$

is maximized means the condition that $$\sum_{x \in M} e(x, \xi)$$

is maximized, thus Equation 8 has to be maximized.

$$\sum_{x \in M} \sum_{\xi} e(x, \xi) = \sum_{x \in M} \sum_{\xi} h(\xi - x) m(\xi) \Delta\xi \qquad (8)$$

Figure 2:
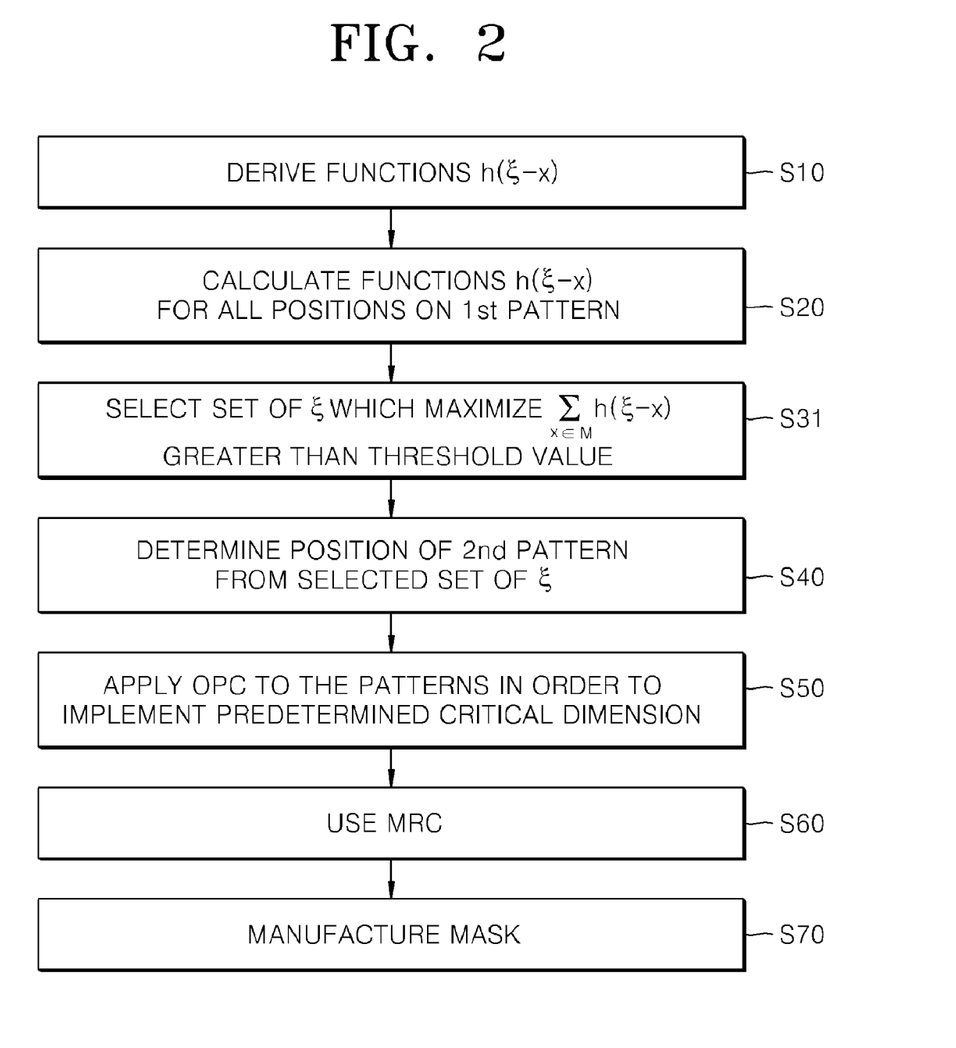

Referring to FIG. 2, in order to select the set of $\xi$ which maximize Equation 8, Equation 9 has to be satisfied. Here it is considered that a transmittance $m(\xi)$ of a typical mask is greater than 0.

$$\sum_{x \in M} h(\xi - x) \geq T \geq 0 \qquad (9)$$

Figure 3:
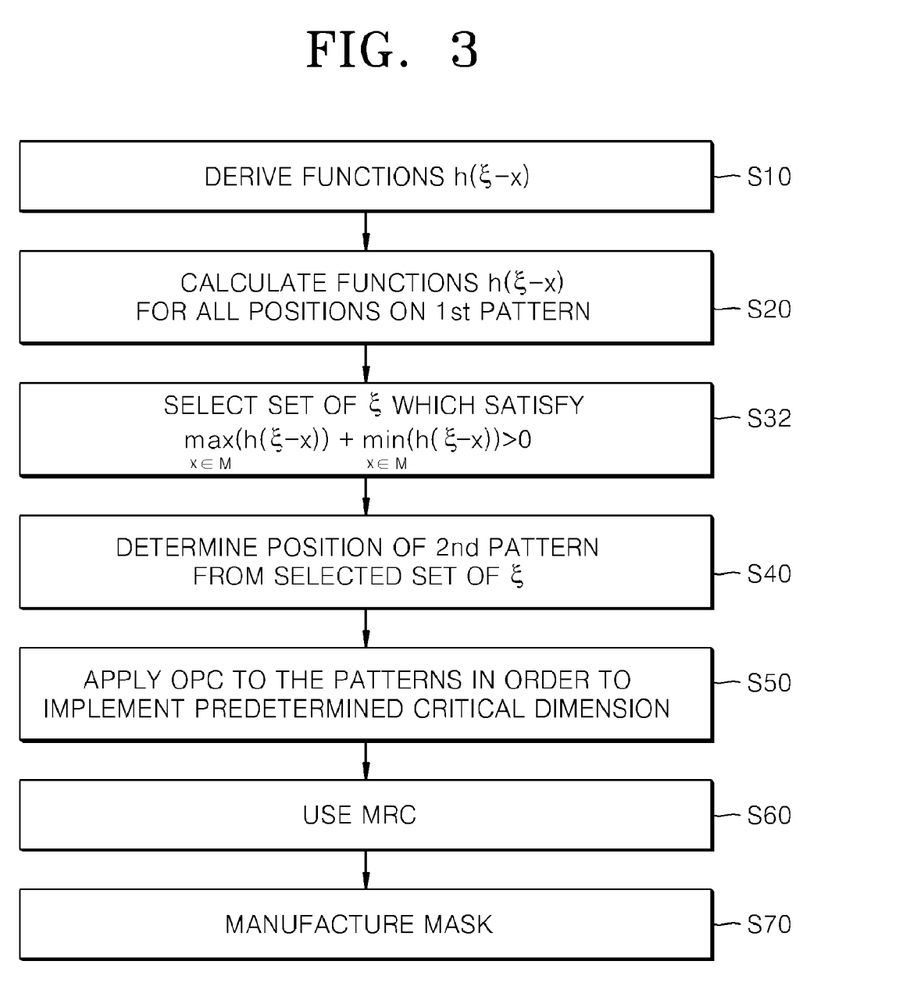

Referring to FIGS. 2 and 3, in operation S20, functions $h(\xi-x)$ of a second pattern for all positions on first patterns are calculated by referring to a look-up table.

Figure 6:
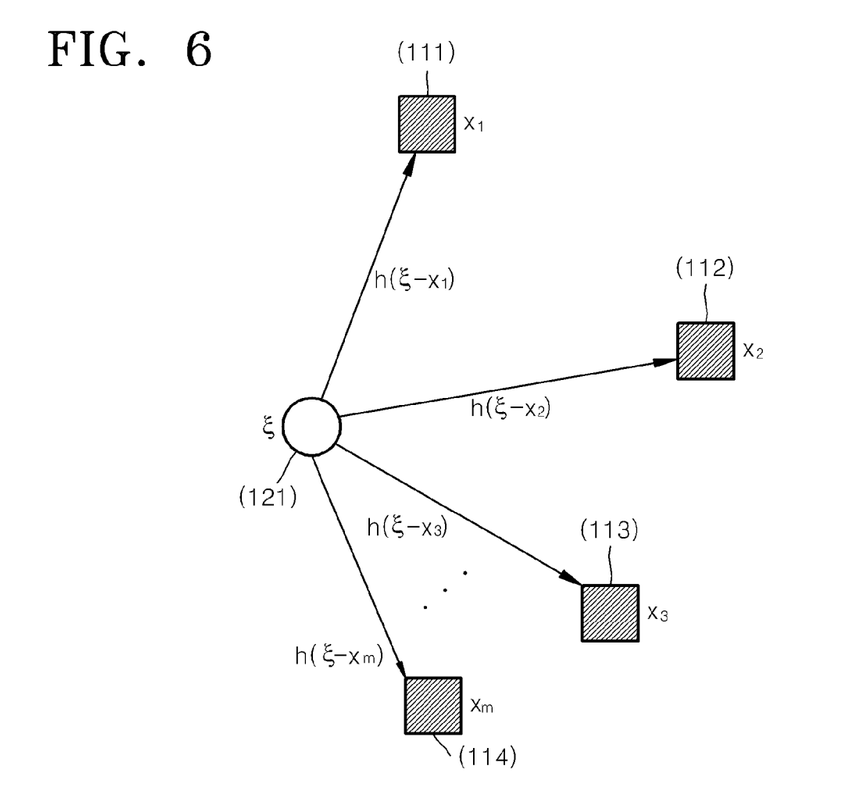
FIG. 6 is a flow diagram that is referenced to describe methods of calculating functions h of a second pattern for all positions on first patterns according to some exemplary embodiments.

FIG. 6 is a flow diagram that is referenced to describe a method/apparatus for calculating functions h as a second pattern for all positions on first patterns according to some exemplary embodiments. Referring to FIG. 6, a second pattern 121 is fixed and then $h(\xi-x)$ is calculated for each of all positions on first patterns. That is, a function $h(\xi-x_1)$ for a position $X_1$ of a first pattern 111 can be obtained directly from a table of functions h calculated in advance. A function $h(\xi-x2)$ for a position $X_2$ of a first pattern 112 can be obtained directly from the table of functions h calculated in advance. A function $h(\xi-x3)$ for a position $X_3$ of a first pattern 113 can be obtained directly from the table of functions h calculated in advance. A function $h(\xi-Xm)$ for a position Xm of a first pattern 114 can be obtained directly from the table of functions h calculated in advance.

Thus, according to the method of FIG. 2, in operation S31, a set of $\xi$ which make $$\sum_{x \in M} h(\xi - x)$$

greater than a first threshold value $T_1$ are selected. In operation S40, the position of the second pattern is determined from the set of $\xi$. Here, M indicates the entire domain of the mask. The first threshold value $T_1$ may be set to zero so that the functions h can contribute to the image intensity I(x) as a positive value. That is, when a value obtained by fixing the position of the second pattern 121, immediately calculating the function h for each of all the positions of the first patterns on the mask, and summing up the functions h is greater than 0 as shown in Equation 9, a second pattern may be generated at the position of the second pattern 121. However, when a value obtained by fixing the position of the second pattern 121, immediately calculating the function h for each of all the positions of the first patterns on the mask, and summing up the functions h is less than 0, a second pattern may not be generated at the position of the second pattern 121. Although the method of FIG. 2 can be advantageous in determining an optimal position of a second pattern, an undesirable length of time may be needed to sum up functions h for all areas of a mask.

Accordingly, the position of a second pattern may be determined from a set of $\xi$ which satisfy a condition that a linear combination of the maximum and the minimum of the function $h(\xi-x)$ is equal to or greater than a second threshold value $T_2$, without having to sum up all functions h. Referring to FIG. 3, in operation S32, a set of $\xi$ which satisfy a condition that Equation 10 is equal to or greater than the second threshold value $T_2$ are selected. In operation S40, the position of the second pattern is determined from the selected set of $\xi$.

$$A \cdot \max_{x \in M} h(\xi - x) + B \cdot \min_{x \in M} h(\xi - x) \qquad (10)$$

where M indicates the entire domain of the mask.

The second threshold value $T_2$ may be set to zero so that the function h can contribute to the image intensity I(x) as a positive value. Also, A and B may be constants and may preferably be 0.5. That is, the integral area of the function h is simply calculated by averaging the maximum and the minimum. However, the values of A and B are exemplary, and may each be, for example, 1. Unlike the method of FIG. 2 using Equation 9, since the method of FIG. 3 using Equation 10 does not have to sum up all functions h, a time taken to determine the position of the second pattern can be reduced.

Figure 4:
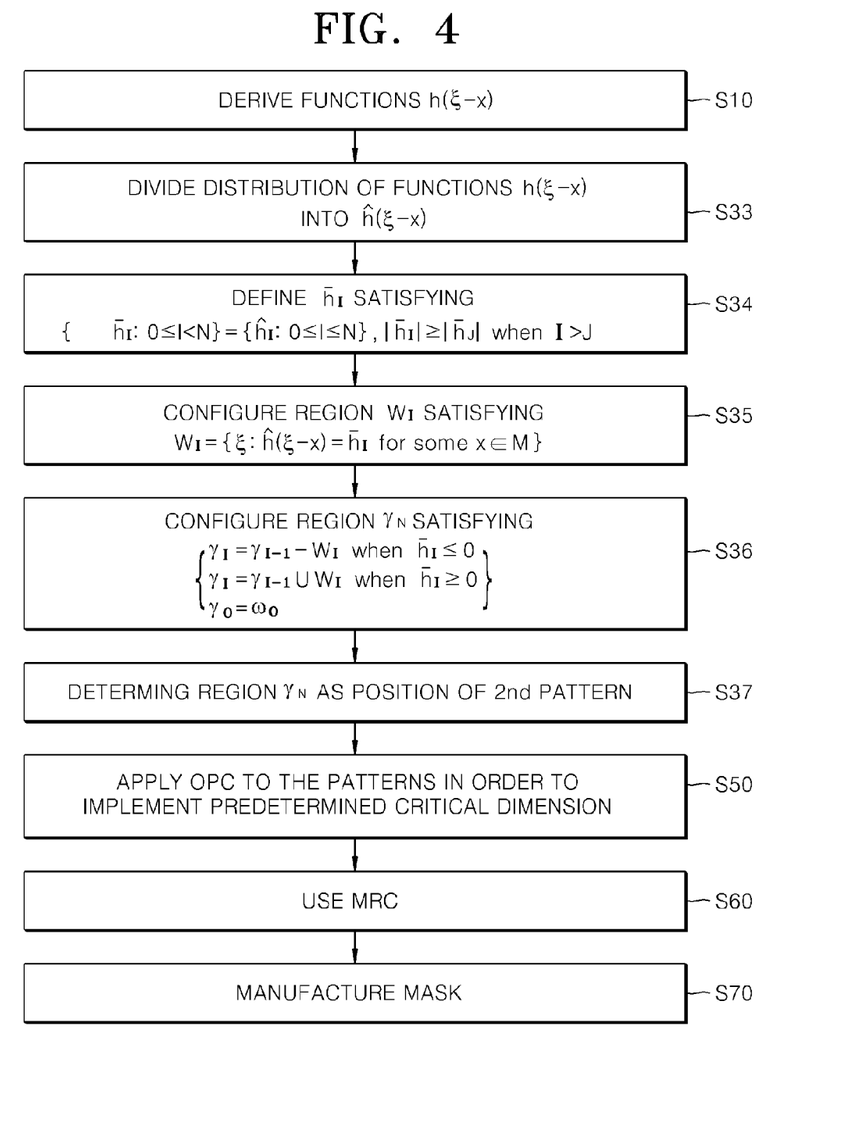

However, the method of FIG. 3 requires time to calculate the minimum and the maximum of $h(\xi-x)$ with respect to x and $\xi$ over entire domain. Methods of more quickly arranging mask patterns are shown in FIG. 4. That is, a method of reducing calculation time by calculating the maximum and the minimum of $h(\xi-x)$ with respect to only a selected, limited region instead of calculating the maximum and the minimum of $h(\xi-x)$ with respect to the entire domain, is provided.

Figure 7:
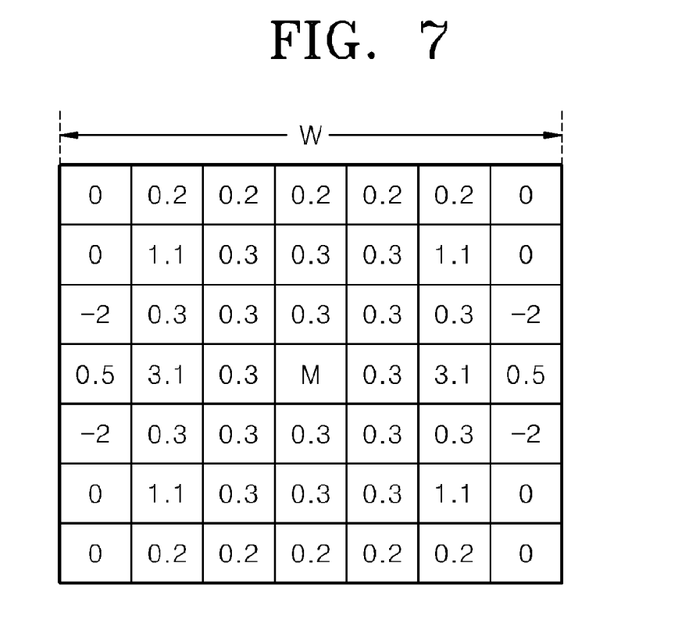
FIG. 7 illustrates an exemplary distribution of functions h(ξ−x) for neighboring regions of a first pattern having a predetermined size according to some embodiments.

FIG. 7 is a view illustrating the distribution of functions $h(\xi-x)$ for neighboring regions of a first pattern M having a predetermined size. Referring to FIG. 7, for example, the functions $h(\xi-x)$ have values of −2, 0, 0.2, 0.3, 1.1, and 3.1. The distribution of the functions $h(\xi-x)$ has a finite width W about the first pattern M. The width W is approximately 1 to 2 and corresponds to 10 to 2000 pixels. However, the above value of the width is exemplary and does not limit the technical spirit of the present disclosure. The methods of FIG. 4 discretizes the neighboring regions of the first pattern M into finite regions and replaces the distribution of the functions $h(\xi-x)$ with representative values $\hat{h}(x,\xi)$ of the deiscretized regions.

Figure 8:
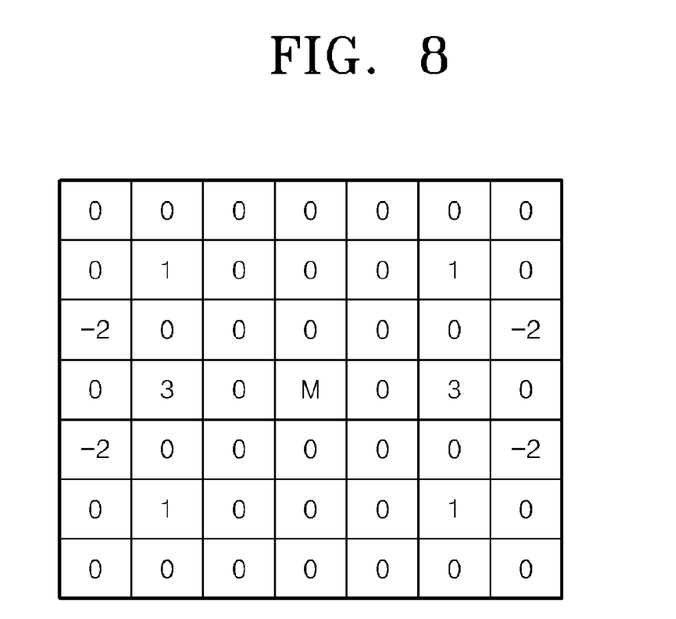
FIG. 8 illustrates a distribution of representative values replacing the functions h(ξ−x) for the neighboring regions of the first pattern having the predetermined size of FIG. 7 according to some exemplary embodiments.

FIG. 8 illustrates the distribution of the representative values $\hat{h}(x,\xi)$ replacing the functions $h(\xi-x)$ for the neighboring regions of the first pattern M of FIG. 7 (e.g., operation S33 of FIG. 4). Referring to FIG. 8, for example, when decimals are omitted and remaining numbers are representative values $\hat{h}(x,\xi)$ for the neighboring regions of the first pattern M, the representative values $\hat{h}(x,\xi)$ are −2, 0, 1, and 3. That is, $\hat{h}_0$, $\hat{h}_1$, $\hat{h}_2$, $\hat{h}_3$ become −2, 0, 1, and 3, respectively. However, the representative values $\hat{h}(x,\xi)$ may be determined in various ways. For example, the representative values $\hat{h}(x,\xi)$ may be determined as a value obtained by subtracting from $h(x,\xi)$ the predetermined second threshold value $T_2$, which is mentioned with respect to Equation 10. The distribution of $\bar{h}(x,\xi)$ may be derived from the distribution of $\hat{h}(x,\xi)$. $\bar{h}(x,\xi)$ is defined (e.g., operation S34 of FIG. 4) by $$\{\bar{h}_I : 0 \leq I \leq N\} = \{\hat{h}_I : 0 \leq I \leq N\} \text{ when } I \geq J, |\bar{h}_I| \geq |\bar{h}_J| \qquad (11)$$

According to $\bar{h}(x,\xi)$ defined by Equation 11, $\bar{h}_0$, $\bar{h}_1$, $\bar{h}_2$, $\bar{h}_3$, become 0, 1, −2, and 3, respectively.

A region $\omega_I$ is defined (e.g., operation S35 of FIG. 4) by $$\omega_I = \{\xi : \hat{h}(\xi - x) = \bar{h}_I \text{ for some } x \in M\} \qquad (12)$$

The region $\omega_I$ is formed of a finite number of polygons.

FIGS. 9 through 12 illustrate regions where $\bar{h}_0$, $\bar{h}_1$, $\bar{h}_2$, $\bar{h}_3$ respectively are 0, 1, −2, and 3 among the neighboring regions of the first pattern M having the predetermined size of FIG. 7.

Figure 9:
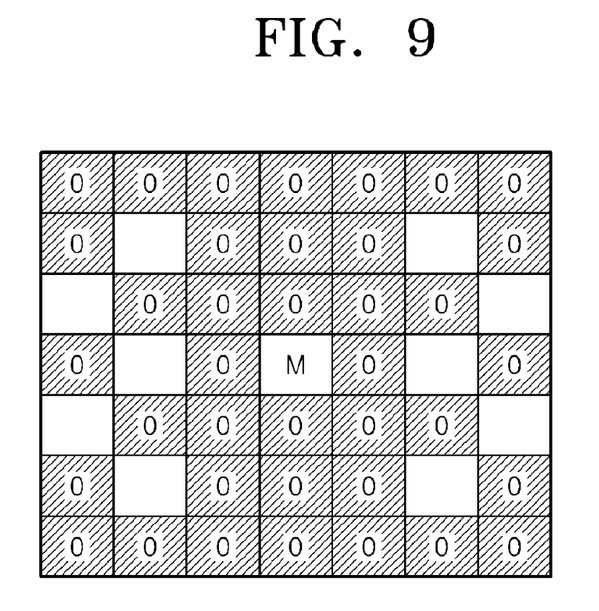
FIGS. 9 through 12 illustrates regions where $\overline{h}_0, \overline{h}_1, \overline{h}_2, \overline{h}_3$ are respectively 0, 1, −2, and 3 among the neighboring regions of the first pattern having the predetermined size of FIG. 7 according to some exemplary embodiments.

Referring to FIG. 9, a region where $\bar{h}_0$ is 0 is formed about the first pattern M having the predetermined size. The distribution of values of $\bar{h}_0$ has a finite width about the first pattern M. The width is approximately 1 to 2 and corresponds to 10 to 2000 pixels. However, the above value of the width is exemplary and does not limit the technical spirit of the present disclosure. Since a region $\omega_0$ is a region having $\bar{h}_0$ on all first patterns on a mask domain, the region having $\bar{h}_0$ shown in FIG. 9 is shifted and repeated for all the first patterns on the mask domain. That is, regions $\omega_0$ are simply formed by shifting and repeating the region having $\bar{h}_0$ of FIG. 9 with respect to all the first patterns on the mask domain.

Figure 10:
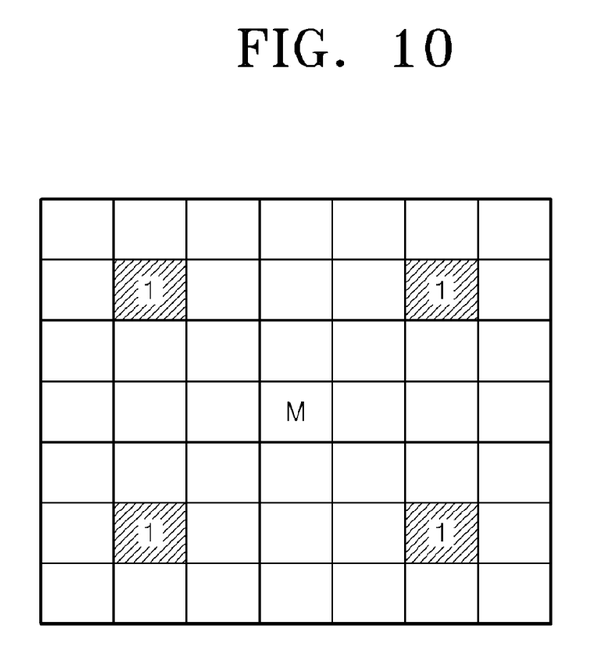
Figure 11:
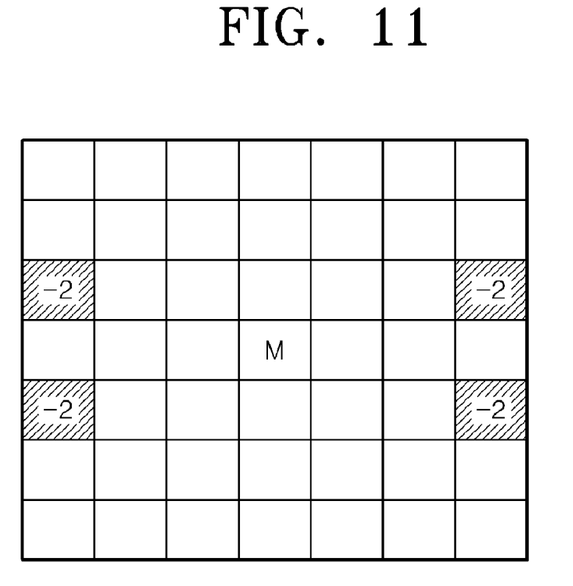
Figure 12:
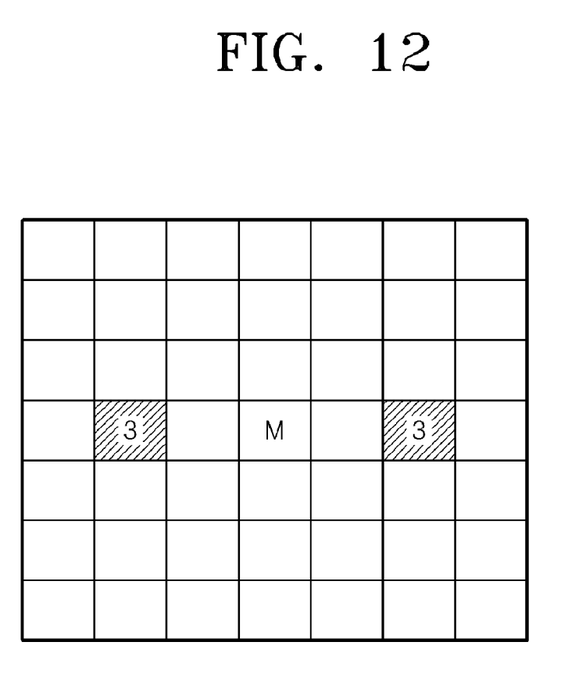

In the same manner, regions $\omega_1$ are formed by repeating a region having $\bar{h}_1$ of FIG. 10 with respect to all the first patterns on the mask domain. Also, regions $\omega_2$ are formed by repeating a region having $\bar{h}_2$ of FIG. 11 with respect to all the first patterns on the mask domain. Regions $\omega_3$ are formed by repeating a region having $\bar{h}_3$ of FIG. 12 with respect to all the first patterns on the mask domain.

A second pattern may be placed in a region $\gamma_N$ defined by Equation 13 (e.g., operation S36 of FIG. 4) by using the region $\omega_I$.

$$\gamma_I = \gamma_{I-1} - \omega_I \text{ when } \overline{h}_I \leq 0 \qquad (13)$$
$$= \gamma_{I-1} \cup \omega_I \text{ when } \overline{h}_I > 0$$
$$\gamma_0 = \omega_0.$$

That is, the region $\gamma_I$ is defined (e.g., operation S37 of FIG. 4) as follows.

When $\overline{h}_I$ is less than 0, the region $\gamma_I$ is obtained by excluding an overlapped region between a region $\gamma_{I-1}$ and a region $\omega_I$ from the region $\gamma_{I-1}$. When $\overline{h}_I$ is greater than 0, the region $\gamma_I$ is obtained by adding the region $\omega_I$ to the region $\gamma_{I-1}$. This will now be explained by using $\hat{h}(x,\xi)$ of FIG. 8.

FIGS. 13 through 16 illustrate exemplary methods of determining a region $\gamma_I$ according to some embodiments.

Figure 13:
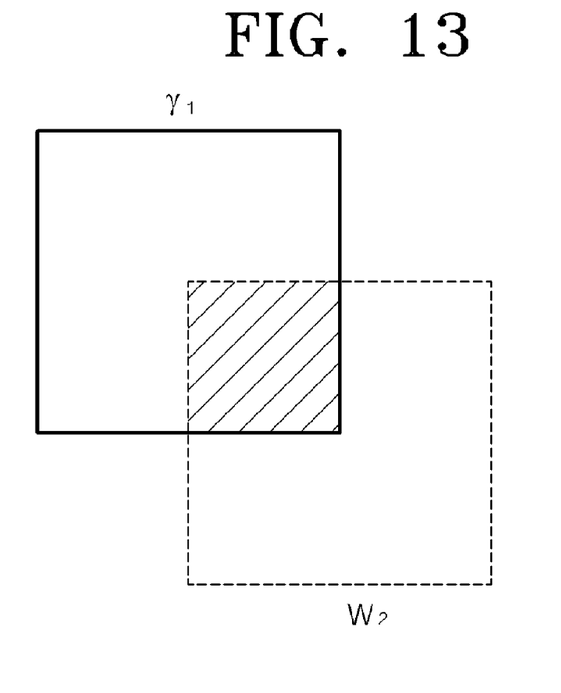
FIGS. 13 through 16 illustrate exemplary apparatus/methods for determining a region $\gamma_I$ according to some embodiments.
Figure 14:
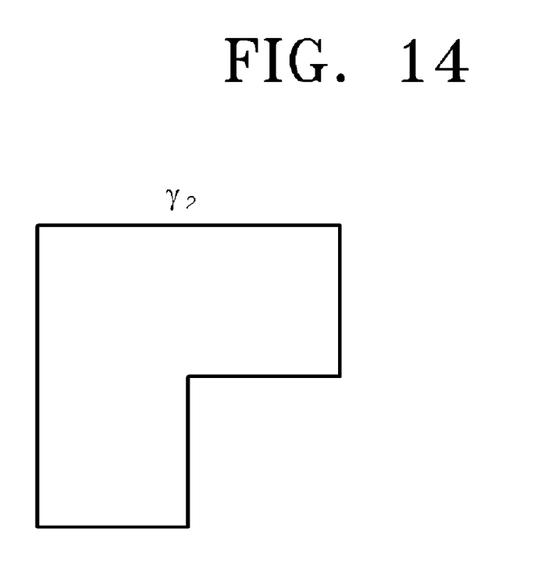

First, referring to FIGS. 13 and 14, since $\overline{h}_2$ is less than 0 as described above, a region $\gamma_2$ is obtained by excluding an overlapped region between the regions $\gamma_1$ and $\omega_2$ from the region $\gamma_1$.

Figure 15:
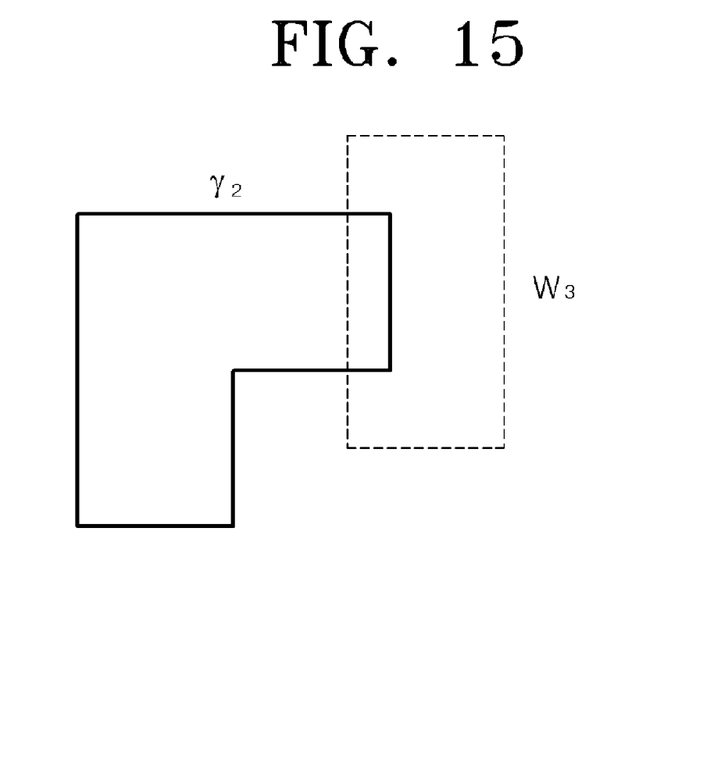
Figure 16:
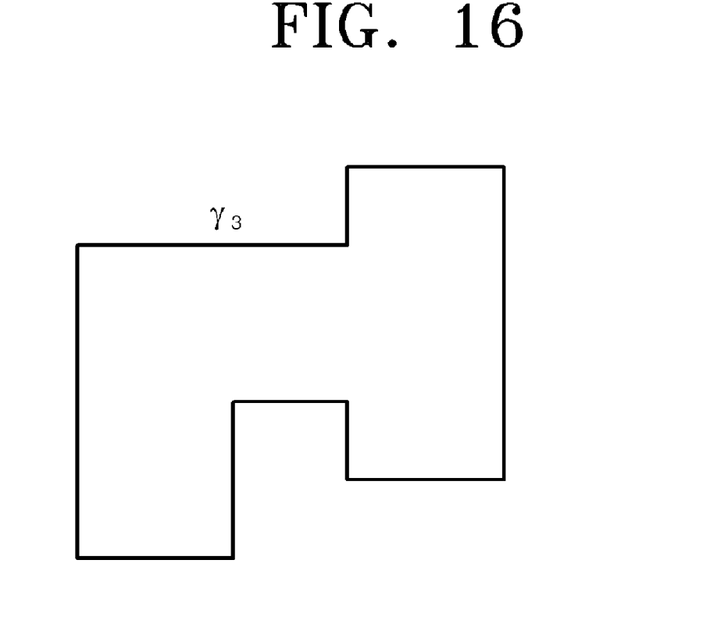

Referring to FIGS. 15 and 16, since $\overline{h}_3$ is greater than 0, a region $\gamma_3$ is obtained by adding a region $\omega_3$ to the region $\gamma_2$.

By proving mathematically, the inventors could verify that a region $\gamma_N$ obtained in this manner is equal to a region $\hat{\Pi}$ of Equation 14.

$$\hat{\Pi} = \left\{\xi : \max_{x \in M} \hat{h}(\xi - x) + \min_{x \in M} \hat{h}(\xi - x) > 0\right\}. \qquad (14)$$

The methods of placing the second pattern in the region $\gamma_N$ of FIG. 4 may advantageously have a high calculation efficiency. That is, the region $\hat{\Pi}$ is determined by calculating each pixel whereas the region $\gamma_N$ is determined by collecting pixels according to $\hat{h}(x,\xi)$ to generate polygons and calculating the polygons, thereby improving calculation efficiency. In general, since one polygon in a semiconductor pattern corresponds to more than tens to hundreds of pixels, the methods of calculating polygons can therefore be superior in calculation efficiency to a method of calculating pixels.

By performing multi-stage optimization in which a draft of a layout is determined in consideration of preferentially arranging a second pattern on the region $\gamma_N$, and then the layout is finally adjusted such that Equation 10 has the highest value through subsequent calculation, the layout may be optimized more quickly and accurately.

Furthermore, in order to prevent loss in imaging performance of the added second pattern with respect to all regions of existing patterns, the second pattern may be forced to satisfy Inequality 15 below.

$$h(\xi-x) > 0 \text{ for all } x \in M \qquad (15)$$

This condition may be implemented by forcing the added second pattern to be arranged only in a region $\psi$ defined by Equation 16 below.

$$\psi = \bigcup_I w_I - \bigcup_{h_I < 0} w_I \qquad (16)$$

Subsequent operations will now be explained with reference to FIGS. 1 through 4.

After the operation (e.g., operation S40 of FIG. 1) in which the position of the second pattern is determined, subsequent operations are implemented.

In operation S50, optical proximity correction (OPC) is applied to the first pattern and the second pattern in order to implement a predetermined critical dimension on the semiconductor wafer. Operation S50 may further include disposing an assist feature near the first pattern and the second pattern.

In operation S60, a mask rule check (MRC) is used in order to improve mask performance, that is, in order to accurately reproduce patterns implemented on the semiconductor wafer. The above operations S50 through S60 are performed after the operation S40 in which the position of the second pattern is determined. However, in modified embodiments, the operations S50, and S60 illustrated in FIGS. 1 through 3 may be performed in different orders and some of the operations S50 through S60 may be omitted. In operation S70, a design of mask patterns arranged after the operations S10 through S60 are performed is implemented as patterns on the mask in a subsequent manufacturing process. The method of arranging the mask patterns is a systematic and general method of placing a second pattern, such that stable results can be obtained irrespective of the shape and arrangement of a first pattern and the position of the second pattern can be automatically determined.

The operations and methods described herein can be implemented by computer-readable program code. This program code may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

This program code may also be stored in a computer-readable storage medium that can direct a computer (also referred to as a programmable data processing apparatus) to function in a particular manner, such that the instructions stored in the computer-readable storage medium produce an article of manufacture including instructions which implement the function/act specified in the block diagrams and/or flowchart block or blocks.

A computer-readable storage medium having stored thereon program code for executing the methods and operations of determining an optimal position of a second pattern of a mask according to some embodiments will now be explained.

As described above, the program code stored on the storage medium can be executed by a general purpose computer, special purpose computer, and/or other programmable data processing computer apparatus. In some embodiments, the program code and possibly the associated data records can be stored within the memory of a general-purpose computer, stored at other locations within a computer system, and/or transported on a transportable computer readable storage medium for loading into an appropriate general-purpose computer system. Hence, the embodiments discussed above involve one or more computer program products in the form of one or more modules of program code carried by at least one computer-readable storage medium having computer-readable program code embodied in the medium. Execution of such program code by a processor of the computer system enables the system to implement the catalogue and/or software downloading functions, in essentially the manner performed in the embodiments discussed and illustrated herein.

As used herein, terms such as computer or machine "readable storage medium" refer to any medium that participates in providing instructions to a processor for execution. Such a medium may take many forms, including but not limited to, non-volatile media, and volatile media. Non-volatile media include, for example, optical or magnetic disks, such as any of the storage devices in any computer(s) operating as one of the server platform, discussed above. Volatile media include dynamic semiconductor memory, such as main memory of such a computer platform. Common forms of computer-readable storage media therefore include, for example: a floppy disk, a flexible disk, a hard disk, a magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution.

Accordingly, at least some of the operations and methods described herein for some embodiments, and in other embodiments all of the operations and methods described herein, can be carried-out automatically by a computer executing program code that causes the computer to control an apparatus that positions the mask and/or the device being imaged in response to an electronically sensed contribution of the second pattern to image intensity as described herein. As used herein, the term "automatically" means that the associated function is carried out without human intervention, such as by a computer operating according to predefined program code.

In one embodiment, a mask in accordance with one or more of the embodiments described above is used to manufacture a semiconductor device. For example, the mask may be used to expose a photoresist layer formed on one or more layers on a semiconductor wafer. After exposure of the photoresist, a pattern may be etched into the layer. The layer may be a conductive layer and form gates of transistors, or interconnecting conductive lines, for example. The patterned layer, whether a conductor or an insulator, may form circuit patterns on a semiconductor substrate used to make an integrated circuit.

As described above, the methods of arranging the mask patterns and the apparatus using methods according to various embodiments may more rapidly determine an optimal position of the second pattern for the shape and arrangement of the first pattern.

While the present disclosure has been particularly shown and described with reference to exemplary embodiments thereof, it will be understood by those of ordinary skill in the art that various changes in form and details may be made therein without departing from the spirit and scope of the embodiments, as defined by the following claims.

What is claimed is:

1. A method of manufacturing a semiconductor device, the method comprising:
obtaining a distribution of functions $h(\xi-x)$ representing the contribution of a second pattern to image intensity on a first pattern;
discretizing neighboring regions of the first pattern into finite regions, and replacing the distribution of the functions $h(\xi-x)$ with a distribution of representative values $\bar{h}(x,\xi)$ of the discretized regions, wherein the discretizing comprises:
discretizing the distribution of the functions $h(\xi-x)$ into finite regions, replacing the distribution of the functions $h(\xi-x)$ with a distribution of $\hat{h}(x,\xi)$ consisting of $\hat{h}_0, \hat{h}_1, \hat{h}_2, \ldots, \hat{h}_N$; and
replacing the distribution of $\hat{h}(x,\xi)$ with the distribution of $\bar{h}(x,\xi)$ consisting of $\bar{h}_0, \bar{h}_1, \bar{h}_2, \ldots, \bar{h}_N$ and that satisfies $\{\bar{h}_I : 0 \leq I \leq N\} = \{\hat{h}_I : 0 \leq I \leq N\}$ when $I \geq J, |\bar{h}_I| \geq |\bar{h}_J|$;

determining a position of the second pattern by using polygonal regions having the same $\bar{h}(x,\xi)$; and
manufacturing the semiconductor device with a mask including the second pattern at a position responsive to the determining step,
wherein x is the position of the first pattern and $\xi$ is the position of the second pattern.

2. The method of claim 1, wherein the obtaining of the distribution of the functions $h(\xi-x)$ comprises obtaining the functions $h(\xi-x)$ that satisfy $$\frac{I(x) - I_0(x)}{2\sqrt{I_0(x)}} = h(\xi - x)\, m(\xi)\, \Delta\xi,$$

where $I(x)$ is an image intensity on the first pattern when the second pattern is present, $I_0(x)$ is an image intensity on the first pattern when the second pattern is not present, and $m(\xi)$ is a mask transmittance.

3. The method of claim 1, wherein the determining of the position of the second pattern comprises:
determining, by using the distribution of $\bar{h}(x,\xi)$, a region $\omega_I (I=0,1,\ldots,N)$ satisfying $\omega_I = \{\xi : \hat{h}(\xi-x) = \bar{h}_I$ for some $x \in M\}$;
determining, by using the region $\omega_I (I=0,1,\ldots,N)$, a region $\gamma_N$ satisfying $$\gamma_I = \gamma_{I-1} - \omega_I \text{ when } \bar{h}_I \leq 0$$
$$= \gamma_{I-1} \cup \omega_I \text{ when } \bar{h}_I > 0$$
$$\gamma_0 = \omega_0;$$

and
determining the region $\gamma_N$ as the position of the second pattern,
wherein the $\omega_I$ is formed of a finite number of polygons, and
wherein the M indicates the entire domain of the mask.

4. The method of claim 1, wherein the determining of the position of the second pattern comprises:
determining, with the use of $\bar{h}(x,\xi)$, a region $\omega_I (I=0,1,\ldots,N)$ that satisfies $\omega_I = \{\xi : \hat{h}(\xi-x) = \bar{h}_I$ for some $x \in M\}$;
obtaining a region $\gamma_N$ by excluding a region $\omega_J$ where $\bar{h}_J$ is less than 0 from a region including all the region $\omega_I (I=0, 1,\ldots,N)$; and
determining the region $\gamma_N$ as the position of the second pattern,
wherein the $\omega_I$ is formed of a finite number of polygons, and
wherein the M indicates the entire domain of the mask.

5. The method of claim 1, wherein the determining of the position of the second pattern further comprises determining the position of the second pattern so as to satisfy an inequality below:
$h(\xi-x) > 0$ for all $x \in M$.

6. The method of claim 1, further comprising applying an optical proximity correction process to the first pattern and the second pattern to obtain a critical dimension after the determining of the position of the second pattern.

7. The method of claim 1, further comprising applying a mask rule check process to improve mask performance after the determining of the position of the second pattern.

8. The method of claim 1, wherein the discretizing of the neighboring regions of the first pattern into the finite regions comprises discretizing the neighboring regions into finite square shaped regions.

9. The method of claim 1, wherein the neighboring regions of the first pattern have a width W of 10 to 2000 pixels.

10. The method of claim 1, wherein patterns formed on a semiconductor wafer by exposing the first pattern and the second pattern respectively contribute to an operation of a semiconductor device.

11. A computer program product that is configured to arrange mask patterns, the computer program product comprising a non-transitory computer-readable storage medium having computer-readable program code embodied in the medium, the computer-readable program code comprising:
  computer-readable program code that is configured to obtain a distribution of functions $h(\xi-x)$ representing the contribution of a second pattern to image intensity on a first pattern;
  computer-readable program code that is configured to discretize neighboring regions of the first pattern into finite regions, and to replace the distribution of the functions $h(\xi-x)$ with a distribution of representative values $\bar{h}(x,\xi)$ of the discretized regions; and
  computer-readable program code that is configured to determine a position of the second pattern by using polygonal regions having the same $\bar{h}(x,\xi)$,
  wherein x is the position of the first pattern and $\xi$ is the position of the second pattern, and
  wherein computer-readable program code that is further configured to:
    discretize the distribution of the functions $h(\xi-x)$ into finite regions, replace the distribution of the functions $h(\xi-x)$ with a distribution of $\hat{h}(x,\xi)$ consisting of $\hat{h}_0, \hat{h}_1, \hat{h}_2, \ldots, \hat{h}_N$; and
    replace the distribution of $\hat{h}(x,\xi)$ with the distribution of $\bar{h}(x,\xi)$ consisting of $\bar{h}_0, \bar{h}_1, \bar{h}_2, \ldots, \bar{h}_N$ and that satisfy $$\{\bar{h}_I : 0 \leq I \leq N\} = \{\hat{h}_I : 0 \leq I \leq N\} \text{ when } I \geq J, |\bar{h}_I| \geq |\bar{h}_J|.$$

12. The computer program product of claim 11, wherein the obtaining of the distribution of the functions $h(\xi-x)$ comprises obtaining the functions $h(\xi-x)$ that satisfy $$\frac{I(x) - I_0(x)}{2\sqrt{I_0(x)}} = h(\xi - x)\, m(\xi)\, \Delta\xi,$$

where $I(x)$ is an image intensity on the first pattern when the second pattern is present, $I_0(x)$ is an image intensity on the first pattern when the second pattern is not present, and $m(\xi)$ is a mask transmittance.

13. The computer program product of claim 11, wherein the determining of the position of the second pattern comprises:
  determining, by using the distribution of $\bar{h}(x,\xi)$, a region $\omega_I (I=0,1,\ldots,N)$ satisfying $\omega_I = \{\xi : \hat{h}(\xi-x) = \bar{h}_I \text{ for some } x \in M\}$;
  determining, by using the region $\omega_I (I=0,1,\ldots,N)$, a region $\gamma_N$ satisfying $$\gamma_I = \gamma_{I-1} - \omega_I \text{ when } \bar{h}_I \leq 0$$
$$= \gamma_{I-1} \cup \omega_I \text{ when } \bar{h}_I > 0$$
$$\gamma_0 = \omega_0;$$

and
  determining the region $\gamma_N$ as the position of the second pattern,
  wherein the $\omega_I$ is formed of a finite number of polygons, and
  wherein the M indicates the entire domain of a mask.

14. The computer program product of claim 11, wherein the determining of the position of the second pattern comprises:
  determining, with the use of $\bar{h}(x,\xi)$, a region $\omega_I (I=0,1,\ldots,N)$ that satisfies $\omega_I = \{\xi : \hat{h}(\xi-x) = \bar{h}_I \text{ for some } x \in M\}$;
  obtaining a region $\gamma_N$ by excluding a region $\omega_J$ where $\bar{h}_J$ is less than 0 from a region including all the region $\omega_I (I=0, 1, \ldots, N)$; and
  determining the region $\gamma_N$ as the position of the second pattern,
  wherein the $\omega_I$ is formed of a finite number of polygons, and
  wherein the M indicates the entire domain of a mask.

15. The computer program product of claim 14, wherein the determining of the position of the second pattern further comprises determining the position of the second pattern so as to satisfy an inequality below:
  $h(\xi-x) > 0$ for all $x \in M$.

16. The computer program product of claim 11, wherein the discretizing of the neighboring regions of the first pattern into the finite regions comprises discretizing the neighboring regions into finite square shaped regions.

17. The computer program product of claim 11, wherein the neighboring regions of the first pattern have a width W of 10 to 2000 pixels.

18. The computer program product of claim 11, wherein patterns that are formed on a semiconductor wafer by exposing the first pattern and the second pattern respectively contribute to an operation of a semiconductor device.

* * * * *